US006861325B1

(12) United States Patent
Pan et al.

(10) Patent No.: US 6,861,325 B1
(45) Date of Patent: Mar. 1, 2005

(54) METHODS FOR FABRICATING CMOS-COMPATIBLE LATERAL BIPOLAR JUNCTION TRANSISTORS

(75) Inventors: James N. Pan, Santa Clara, CA (US); Matthew Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 228 days.

(21) Appl. No.: 10/252,681

(22) Filed: Sep. 24, 2002

(51) Int. Cl.[7] .......................................... H01L 21/8228
(52) U.S. Cl. ..................... 438/325; 438/327; 438/366
(58) Field of Search ................................. 438/309–377

(56) References Cited

U.S. PATENT DOCUMENTS

| | | | | |
|---|---|---|---|---|
| 5,714,397 A | * | 2/1998 | Klose | 438/316 |
| 5,952,706 A | * | 9/1999 | Bashir | 257/587 |

* cited by examiner

*Primary Examiner*—H. Jey Tsai
(74) *Attorney, Agent, or Firm*—Harrity & Snyder, LLP

(57) ABSTRACT

A method for fabricating a lateral bipolar junction transistor in an active area of a substrate includes forming a base structure directly on a central portion of the active area without a gate oxide layer being formed on the substrate. The method also includes implanting a first type of dopant into the active area for forming an emitter region and a collector region, and forming contacts and interconnects for the base structure and emitter and collector regions.

17 Claims, 18 Drawing Sheets

US 6,861,325 B1

METHODS FOR FABRICATING CMOS-COMPATIBLE LATERAL BIPOLAR JUNCTION TRANSISTORS

FIELD OF THE INVENTION

The present invention relates generally to semiconductor manufacturing and, more particularly, to methods for fabricating a complementary metal-oxide-semiconductor (CMOS) compatible lateral bipolar junction transistor (BJT).

BACKGROUND OF THE INVENTION

The escalating requirements for high densification and performance associated with ultra large scale integration semiconductor devices require design features of 0.25 microns and under, increased transistor and circuit speeds, high reliability, and increased manufacturing throughput. The reduction of design features to 0.25 microns and under challenges the limitations of conventional semiconductor methodology.

In the next decade, CMOS scaling may finally reach its limit. A vertical BiCMOS was considered by some semiconductor designers as a promising candidate for improving circuit speed, but the vertical BiCMOS was not widely accepted due to fabrication complexity. Although a lateral BiCMOS is easy to integrate, the current drive was very low due to the long base width, as limited by photolithography. With the advent of sub-50nm fabrication processing, a lateral BJT can out-perform a CMOS with a much less complicated process.

Therefore, there exists a need for simplified lateral BJT fabrication processes.

SUMMARY OF THE INVENTION

Methods consistent with the present invention address this and other needs by providing a lateral BJT fabrication process that is comparable in complexity to CMOS fabrication processing.

In accordance with the purpose of this invention as embodied and broadly described herein, a method for fabricating a lateral BJT in an active area of a substrate is provided. The method includes forming a base structure directly on a central portion of the active area, implanting a first type of dopant into the active area for forming an emitter region and a collector region, and forming contacts and interconnects for the base structure and emitter and collector regions.

In another implementation consistent with the present invention, a method for fabricating a lateral BJT is provided. The method includes forming a well in an active area of the substrate; forming a base structure in a central portion of the active area, the base structure being formed directly on the substrate; forming spacers on opposite sides of the base structure; and implanting a dopant to form an emitter region and a collector region. The method further includes implanting boron to form a contact for the base structure, reducing a width of the base structure, performing a rapid thermal anneal, depositing inter-layer dielectric material over the active area, and forming metal interconnects over the active area.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Methods consistent with the present invention fabricate a lateral BJT. By fabricating the lateral BJT in a manner similar to conventional CMOS fabrication processing, significant improvements in switching speed can be achieved.

EXEMPLARY PROCESSING

Figure 1:
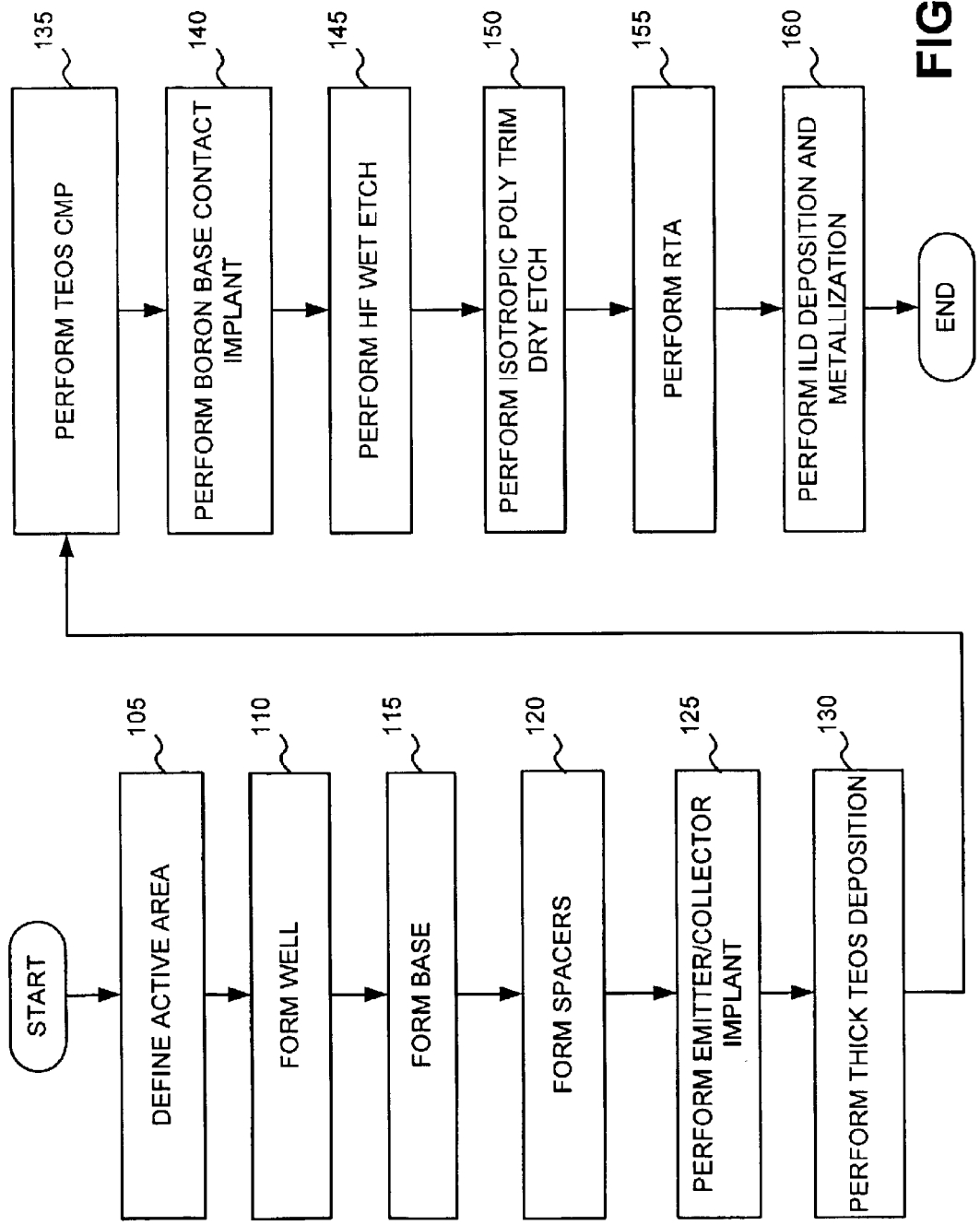
FIG. 1 illustrates an exemplary process for fabricating a lateral BJT consistent with the principles of the invention.
Figure 2:
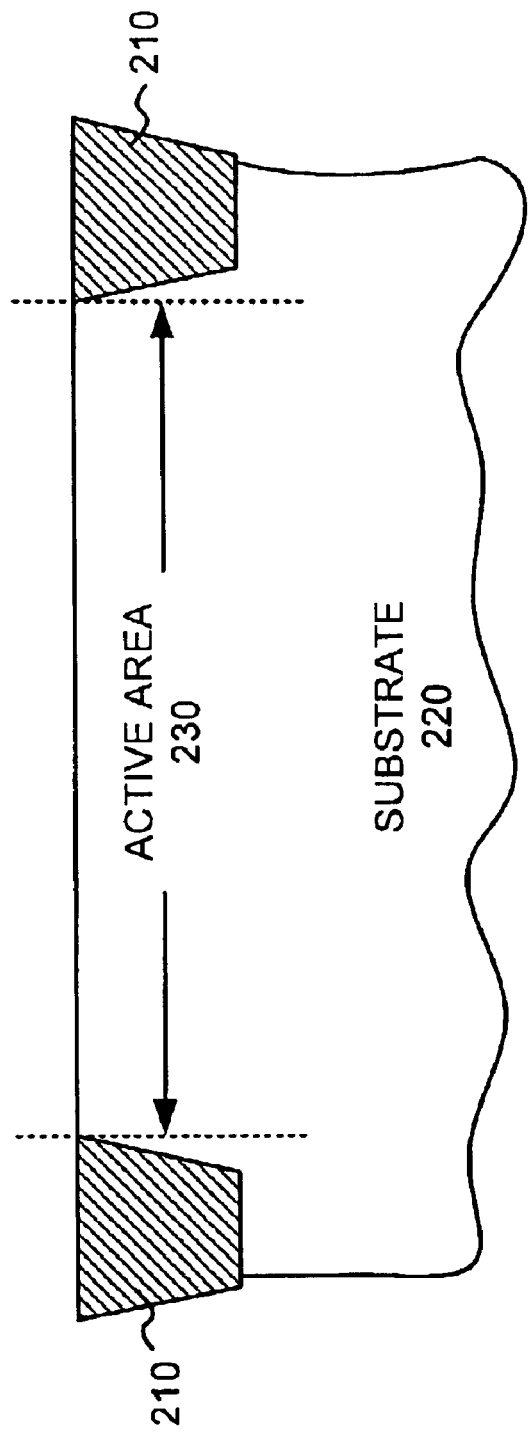
FIGS. 2–12 illustrate exemplary cross-sectional views of a lateral BJT fabricated according to the processing described in FIG. 1.
Figure 3:
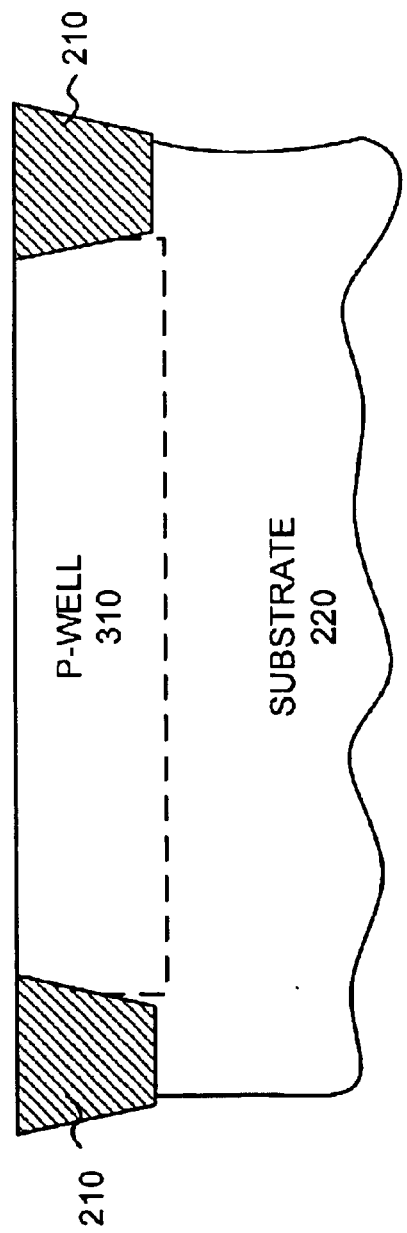
Figure 4:
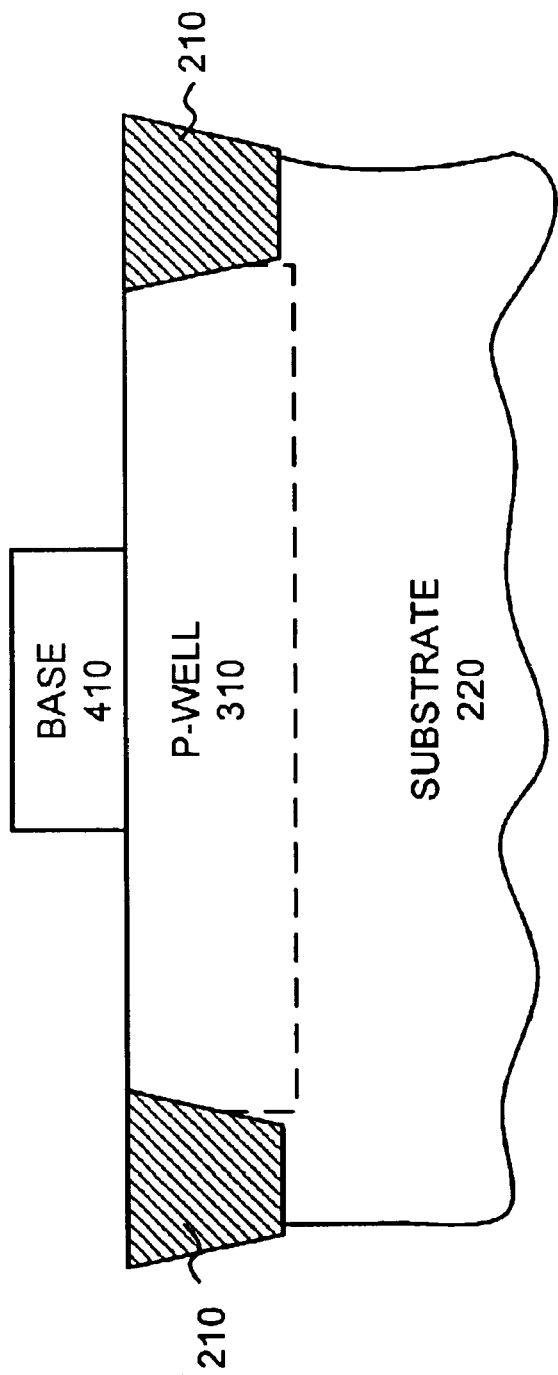
Figure 5:
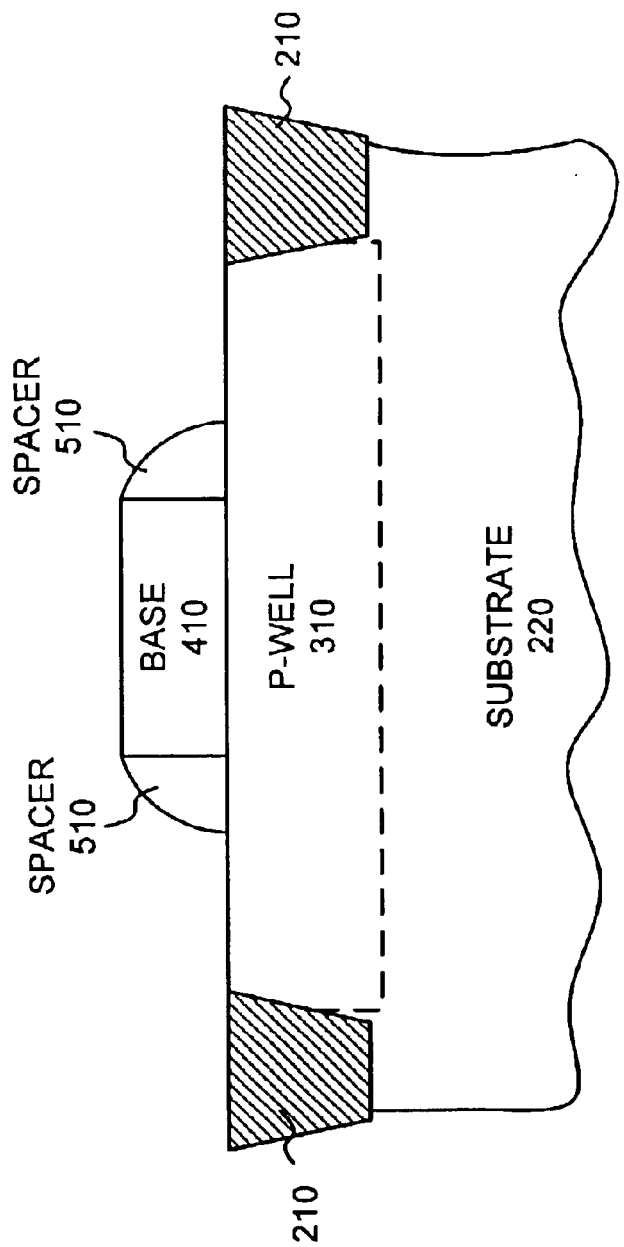
Figure 6:
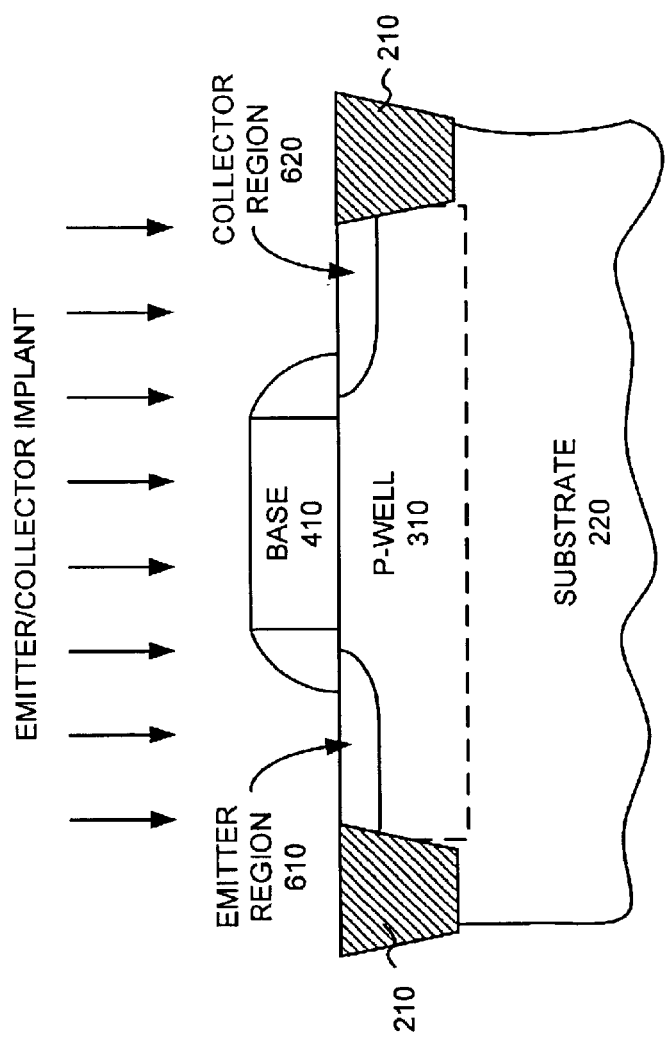

FIG. 1 illustrates an exemplary process for fabricating a lateral BJT consistent with the principles of the invention. FIGS. 2–12 illustrate exemplary cross-sectional views of a lateral BJT fabricated according to the processing described in FIG. 1. By way of example, fabrication of a NPN lateral BJT is described. It will be appreciated that the fabrication processing described herein is equally applicable to fabricating PNP lateral BJTs.

Processing may begin by defining an active area 230 (FIG. 2), through the use of isolation structures 210, on a semiconductor substrate 220 (act 105). In one implementation consistent with the present invention, isolation structures 210 may be shallow trench isolation (STI) structures. Processing for forming such isolation structures are well known in the integrated circuit fabrication arts.

Once active area 230 has been defined, a p-well 310 (FIG. 3) may be formed in active area 230 (act 110). Forming p-well 310 may involve, for example, implanting or diffusing a p-type dopant into the substrate. Once p-well 310 has been formed, a base structure 410 (FIG. 4) may be formed between what will be the emitter region (to the left of base 410) and the collector region (to the right of base 410) (act 115). Similar to conventional CMOS gate formation, base 410 may be formed by depositing a layer of silicon (or other material) across the entire wafer, patterning the semiconductor wafer using a photo resist, and then performing a dry silicon etch. Unlike conventional CMOS gate formation, however, base formation, in accordance with the principles of the present invention, does not require a gate oxide layer. In one implementation, base 410 may be an undoped silicon material having a thickness of approximately 1500 Å.

Once base 410 is formed, spacers 510 (FIG. 5) may be formed in a well known manner (act 120). In one implementation, spacers 510 may be formed by depositing a layer of tetraethoxy silane (TEOS) (or another similar type of material) via chemical vapor deposition (CVD) and anisotropically etching the TEOS layer in a well known manner to form spacers 510 along the edges of base 410. Spacers 510 ensure that emitter/collector regions are formed at the desired locations to optimize transistor performance, notably to optimize channel length and junction depth.

The next stage in the lateral BJT fabrication process may involve implanting the emitter and collector regions via ion implantation (act 125). Implantation of an emitter and collector dopant into exposed portions of active area 230 of substrate 220 forms an emitter region 610 (FIG. 6) and a collector region 620. In the exemplary implementation illustrated in FIG. 6, the emitter and collector dopant may be an N-type dopant, such as phosphorus or some other type of material. For example, N-type impurities may be implanted at a dosage of about $5 \times 10^{14}$ atoms/cm$^2$ to about $5 \times 10^{15}$ atoms/cm$^2$ and an implantation energy of about 10 KeV to about 20 KeV.

Figure 7:
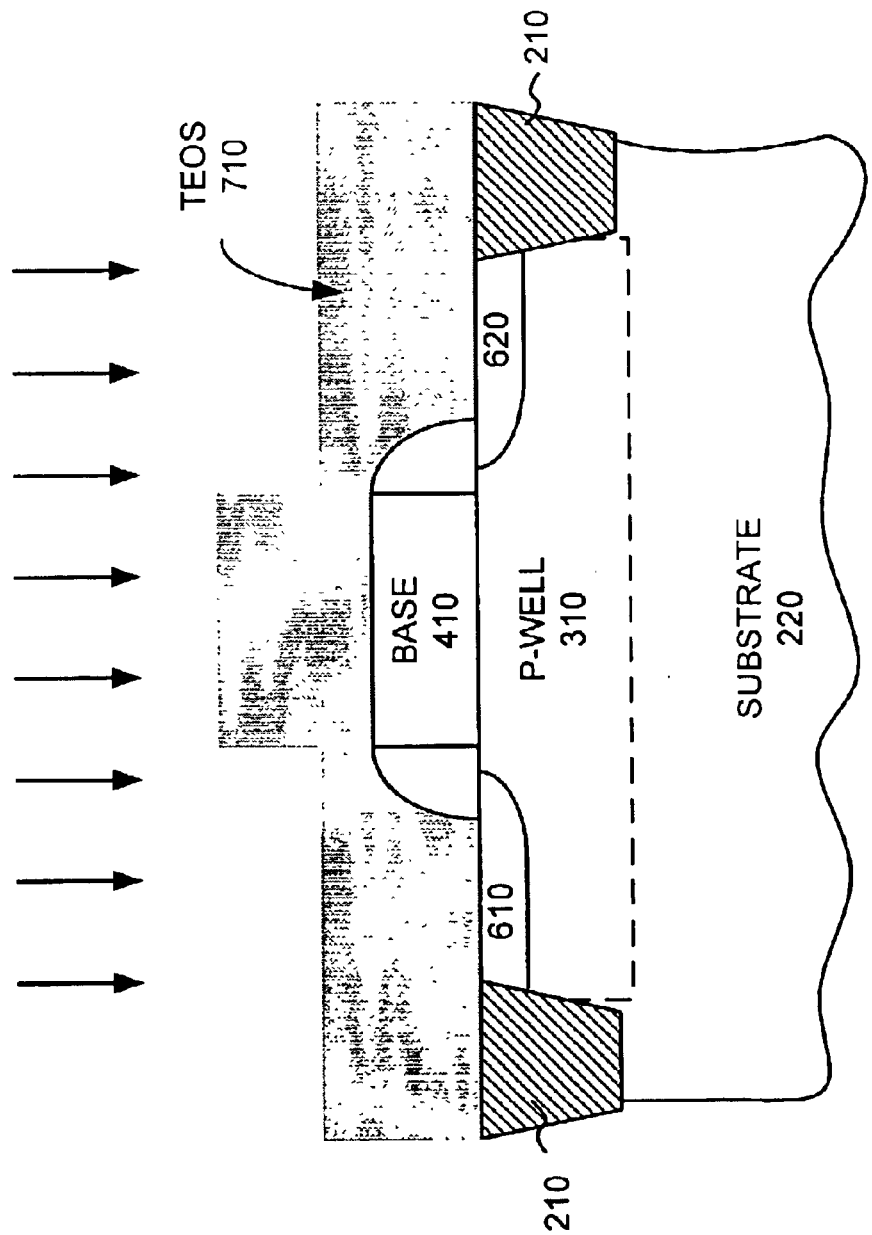
Figure 8:
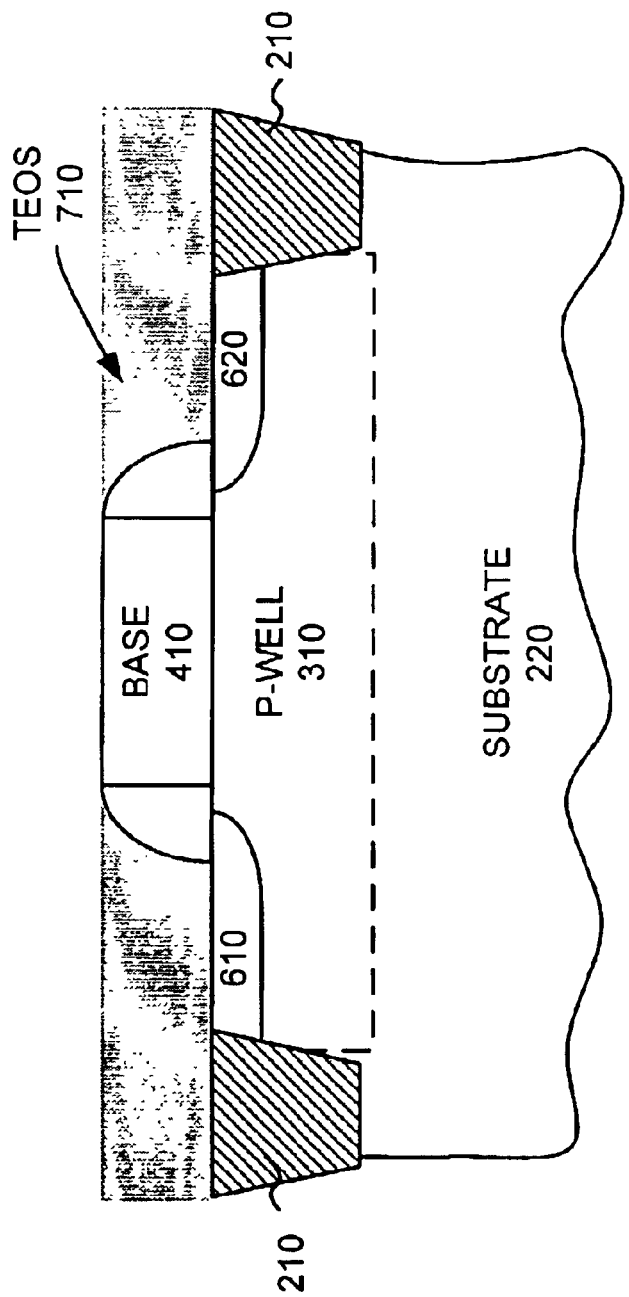
Figure 9:
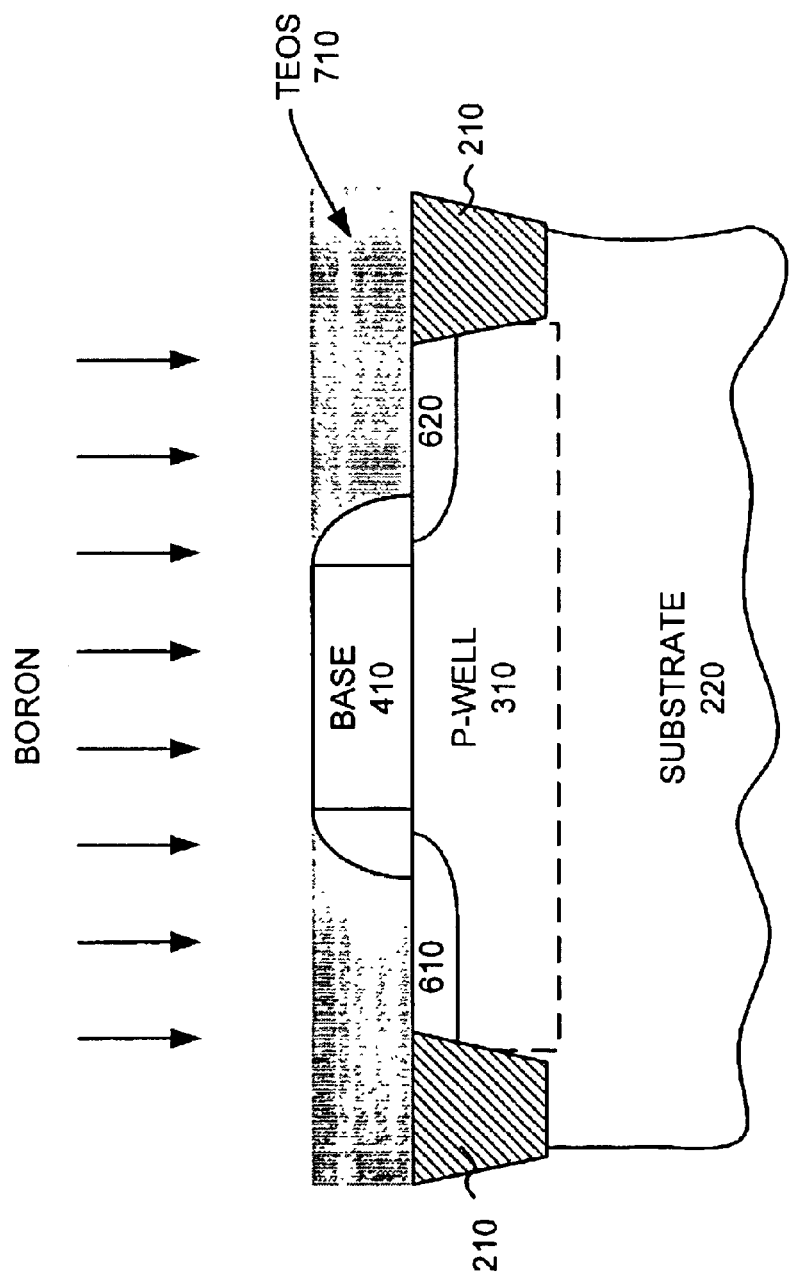

Once emitter and collector regions 610 and 620 have been formed, a thick layer of TEOS (or another similar type of material) 710 (FIG. 7) may be deposited across the entire wafer (act 130). In one implementation, the thickness of TEOS layer 710 may be such that TEOS layer 710 extends above the height of silicon base 410, as illustrated in FIG. 7. Once deposited, TEOS chemical-mechanical polishing (CMP) may be performed to planarize the wafer surface (act 135). As illustrated in FIG. 8, the thickness of TEOS layer 710 may be reduced until the top of silicon base 410 is exposed. Once the surface of the wafer has been planarized to the appropriate height, implantation of the contact for base 410 may be performed (act 140), as illustrated in FIG. 9. In one implementation, boron may be used as the dopant. Boron may be implanted at a dosage of about $1 \times 10^{12}$ atoms/cm$^2$ to about $1 \times 10^{13}$ atoms/cm$^2$ and an implantation energy of about 2 KeV to about 5 KeV. Other types of dopants may alternatively be used. It will be appreciated that TEOS layer 710 prevents the boron implantation operation from affecting emitter and collector regions 610 and 620.

Figure 10:
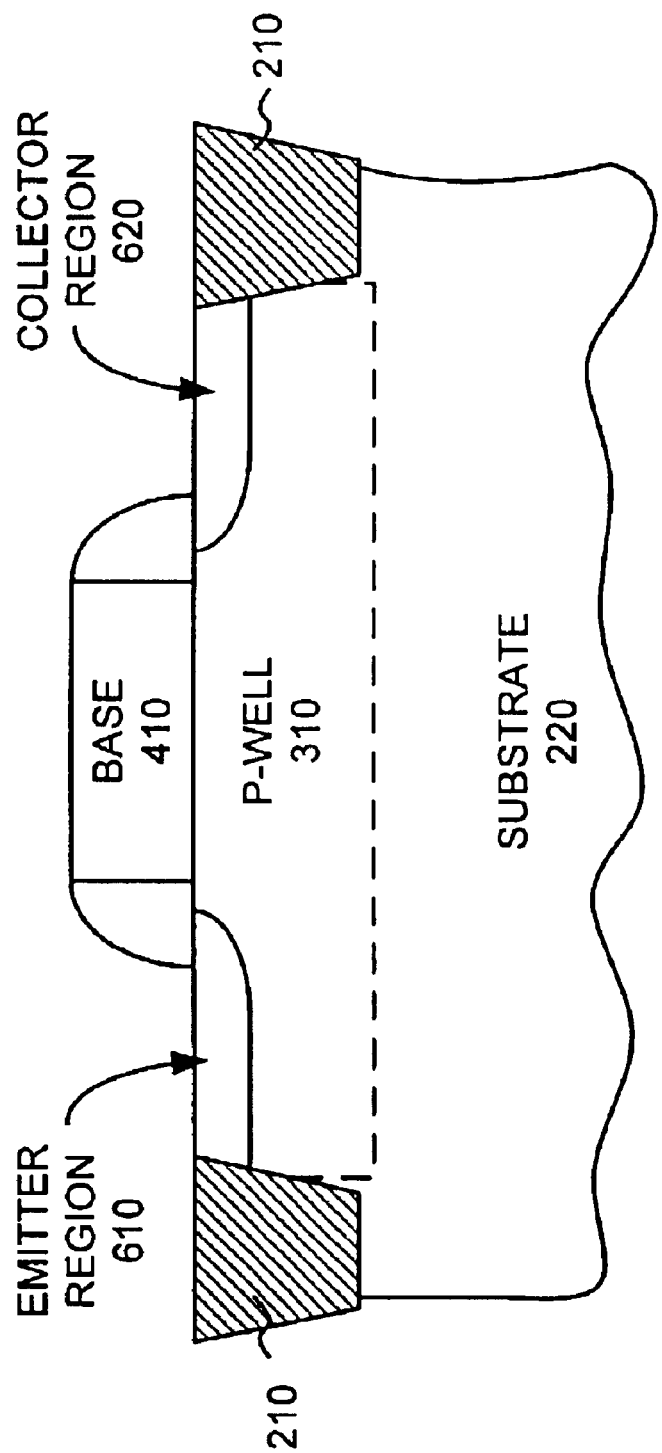
Figure 11:
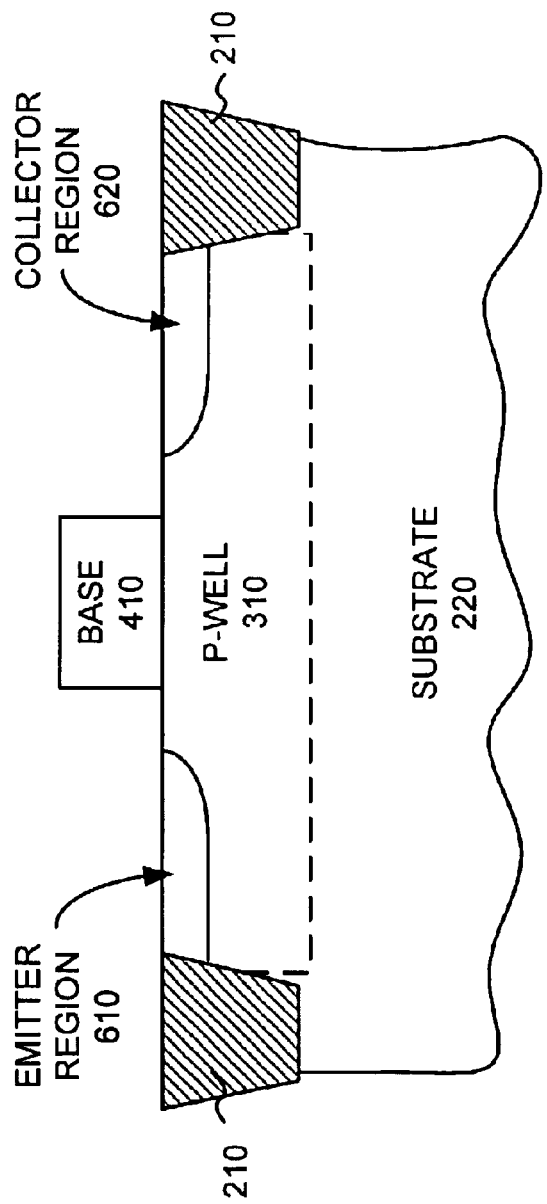

Once the base contact has been implanted, the remaining TEOS may be removed (act 145), as illustrated in FIG. 10. In one implementation consistent with the present invention, the remaining TEOS may be removed by performing a hydrogen fluoride (HF) wet etch. It will be appreciated that the HF wet etch will only affect the TEOS layer since the underlying silicon is impervious to HF. Other techniques for removing the remaining TEOS layer may alternatively be used.

Figure 12:
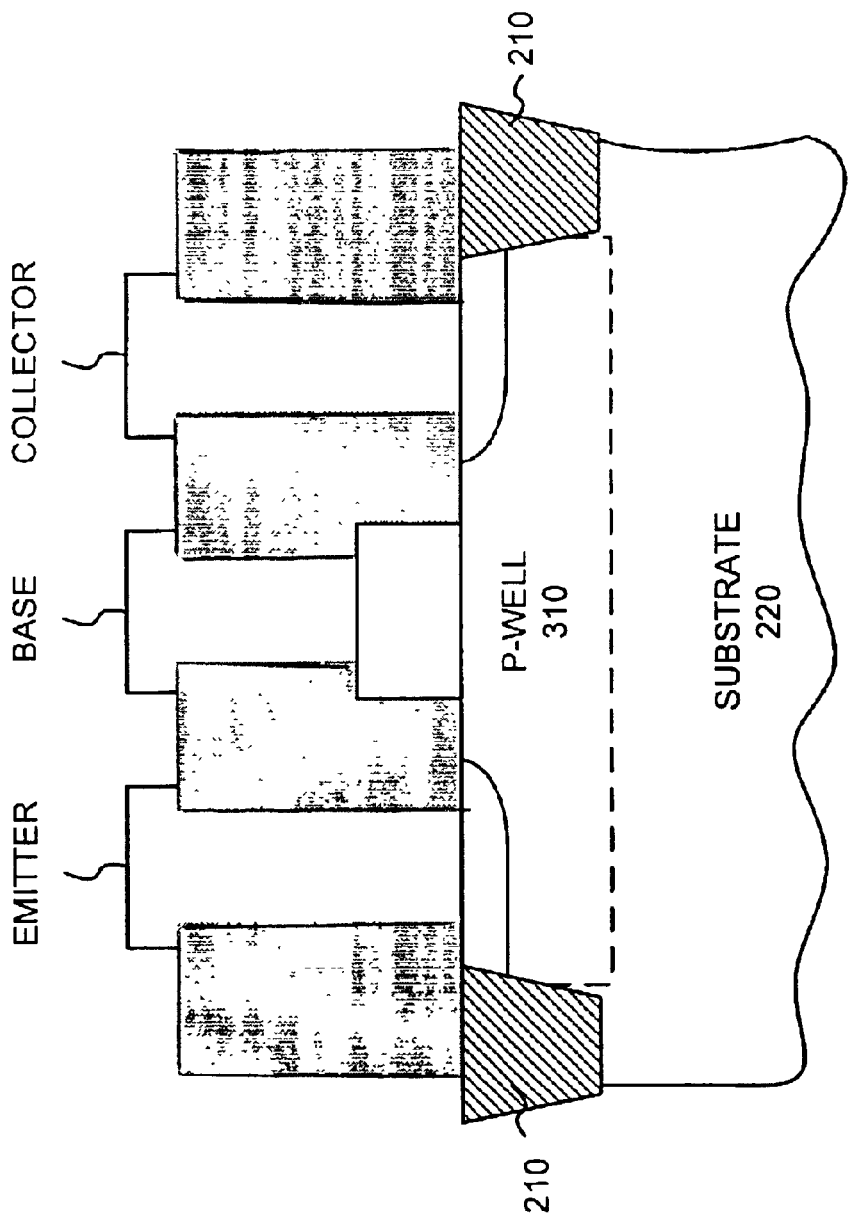

As illustrated in FIG. 1, an isotropic poly trim dry etch may then be performed to effectively reduce the width of base 410 (act 150). As a result, the tunneling leakage current from base 410 to emitter region 610 and to collector region 620 may be minimized. The dopants within base 410, emitter region 610, and collector region 620 may be activated, using, for example, a Rapid Thermal Anneal (RTA) process as known to one of ordinary skill in the art of integrated circuit fabrication (act 155). Conventional interlayer dielectric (ILD) deposition and metallization may then be performed to form contacts and interconnects for the lateral BJT (act 160). FIG. 12 illustrates an exemplary cross-sectional view of lateral BJT after the ILD deposition and metallization.

The above-described processing greatly simplifies BJT fabrication. Moreover, a lateral BJT fabricated in the manner described above provides enhanced circuit speed (e.g., up to 200 GHz) over designs using CMOS technology. With a front base contact, the base resistance of the lateral BJT of the present invention may be significantly reduced when compared to conventional CMOS designs. Other advantages of the present invention include a higher $I_{on}/I_{off}$ ratio and higher drive current when compared to conventional CMOS designs.

ALTERNATIVE PROCESSING

Figure 13:
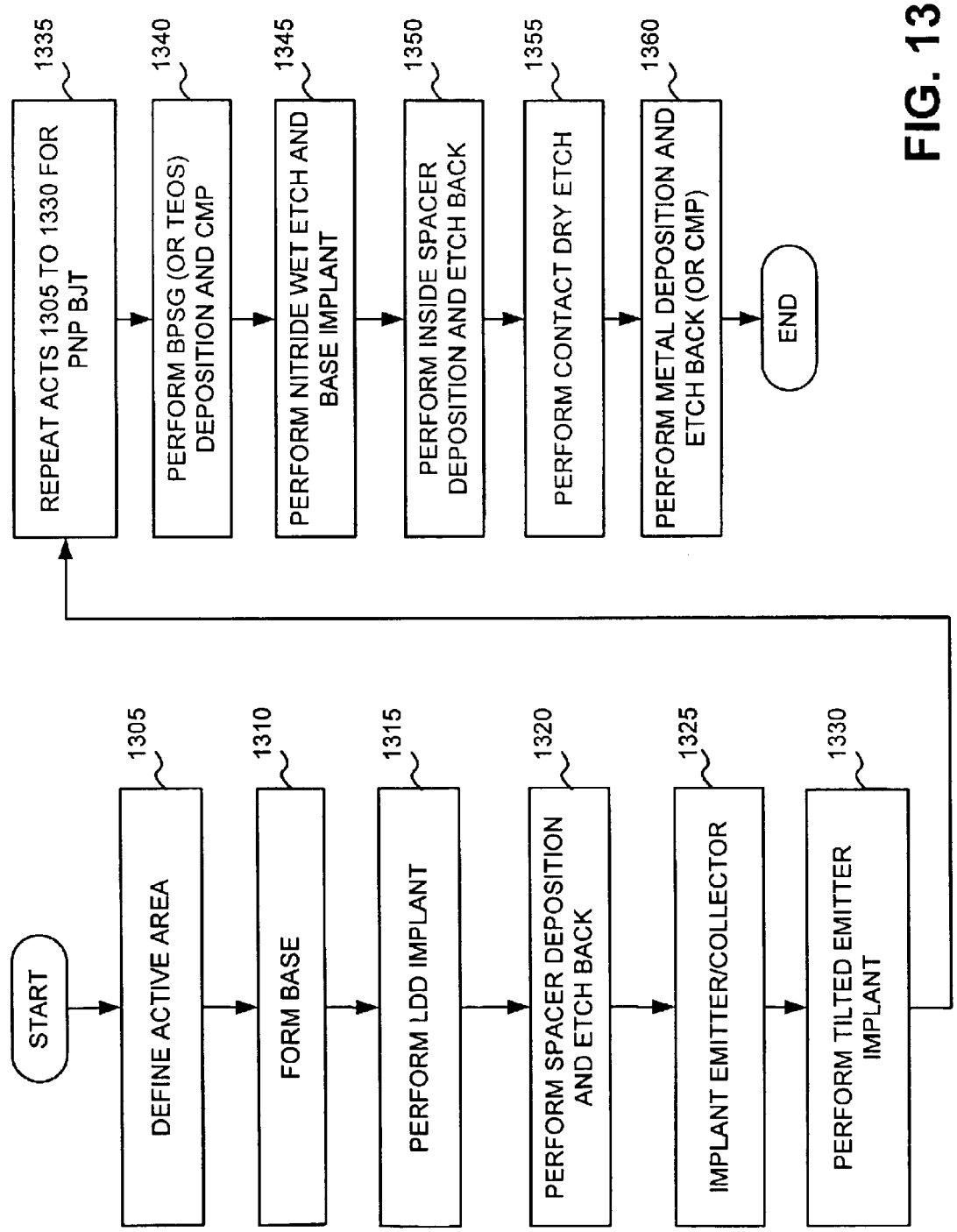
FIG. 13 illustrates an exemplary process, consistent with the present invention, for fabricating a complementary semiconductor on insulator (SOI) SiGe lateral BJT (CLBJT)

FIG. 13 illustrates an exemplary process, consistent with the present invention, for fabricating a complementary semiconductor on insulator (SOI) SiGe lateral BJT (CLBJT) for ultra high speed microprocessor applications. FIGS. 14–18 illustrate exemplary cross-sectional views of a CLBJT fabricated according to the processing described in FIG. 13. Processing may begin by forming isolation structure via, for example, standard STI processing to define an active area (act 1305). It is assumed that a lateral NPN BJT will be initially formed. Base formation and patterning may then be performed (act 1310). This act is similar to gate formation performed in conventional CMOS fabrication processing, except that the gate polysilicon material is replaced with nitride.

Once the base has been formed, lightly-doped drain (LDD) implantation may be performed in a well known manner (act 1315). Spacer deposition and etch back may be performed to form spacers at desired locations to optimize transistor performance (act 1320). The spacer deposition and etch back may be performed in a manner similar to that performed in CMOS fabrication processing, except that the nitride spacer used in conventional CMOS fabrication processing is replaced with a TEOS spacer.

Figure 14:
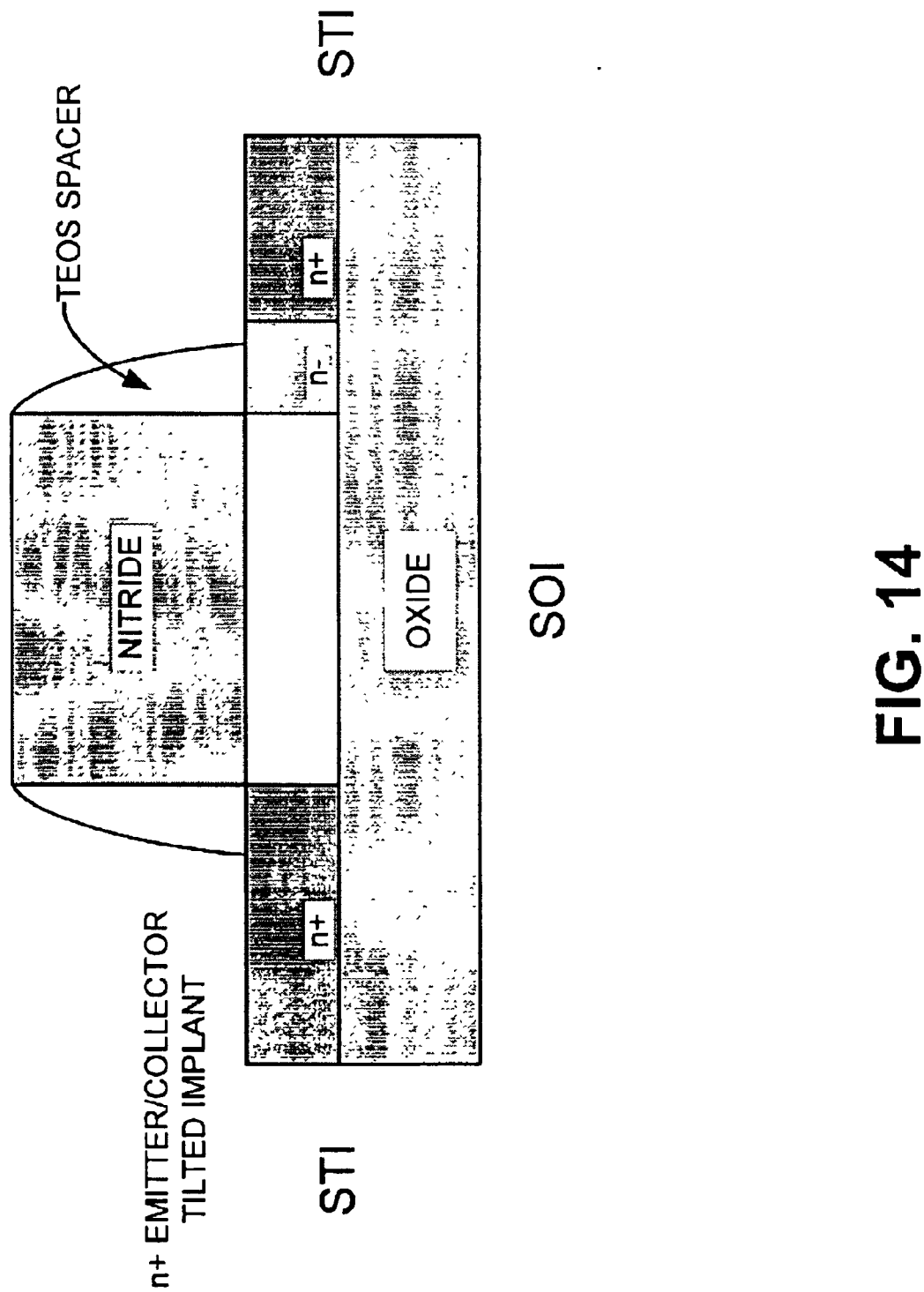
FIGS. 14–18 illustrate exemplary cross-sectional views of a CLBJT fabricated according to the processing described in FIG. 13.
Figure 15:
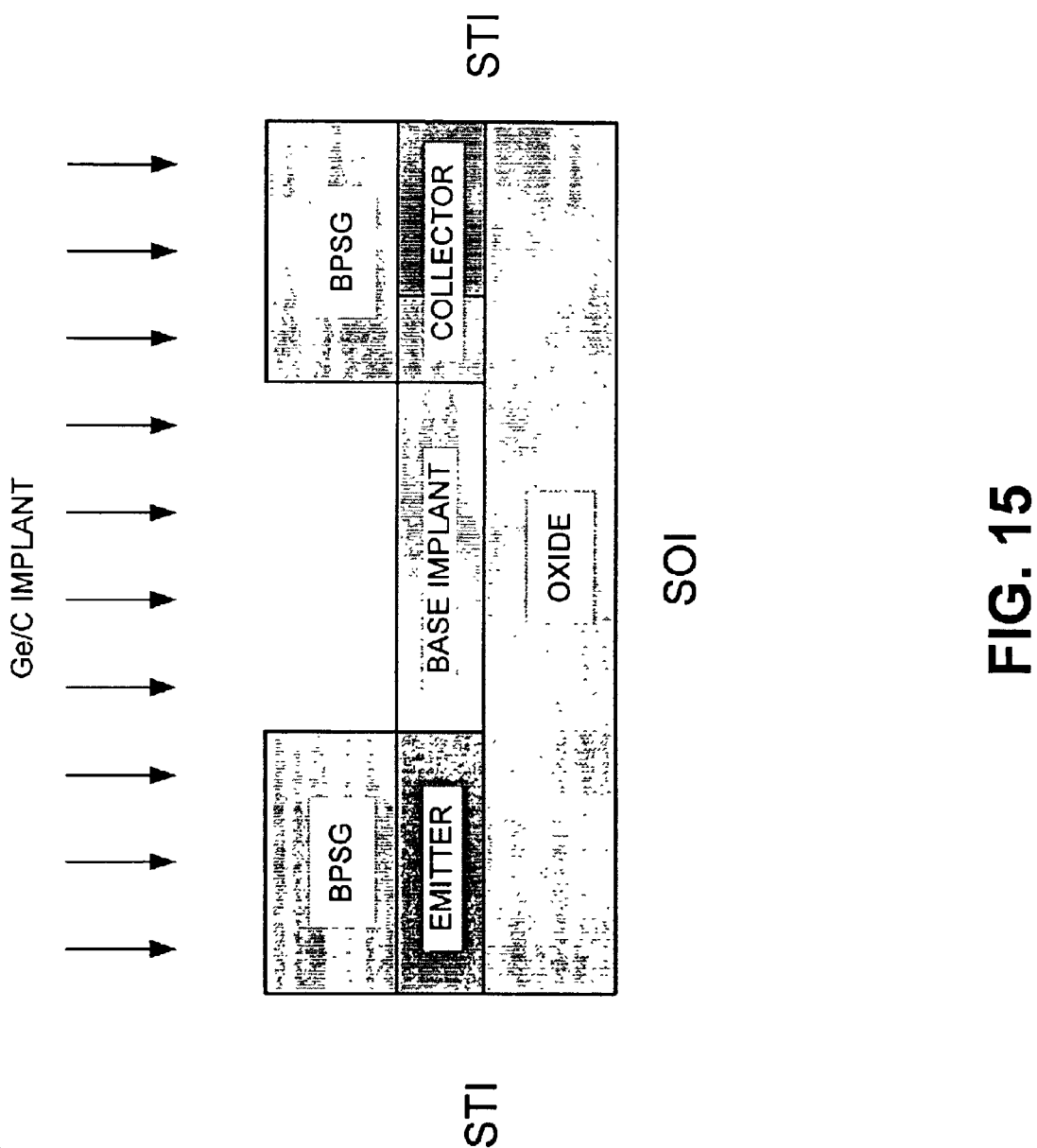

Next, the emitter and collector regions may be implanted via ion implantation (act 1325) and a tilted emitter implant performed in a well known manner (act 1330). FIG. 14 illustrates an exemplary cross-sectional view of the CLBJT after the tilted emitter implant is performed. Acts 1305 through 1330 may then be repeated for fabricating PNP BJTs (act 1335). Once acts 1305 through 1330 have been performed for the PNP BJTs, borophosphosilicate glass (BPSG) (or TEOS) deposition and CMP may be performed in a well known manner (act 1340). A nitride wet etch and base implant, using, for example, Ge/C or other similar type of dopant, may then be performed (act 1345), as illustrated in FIG. 15.

Figure 16:
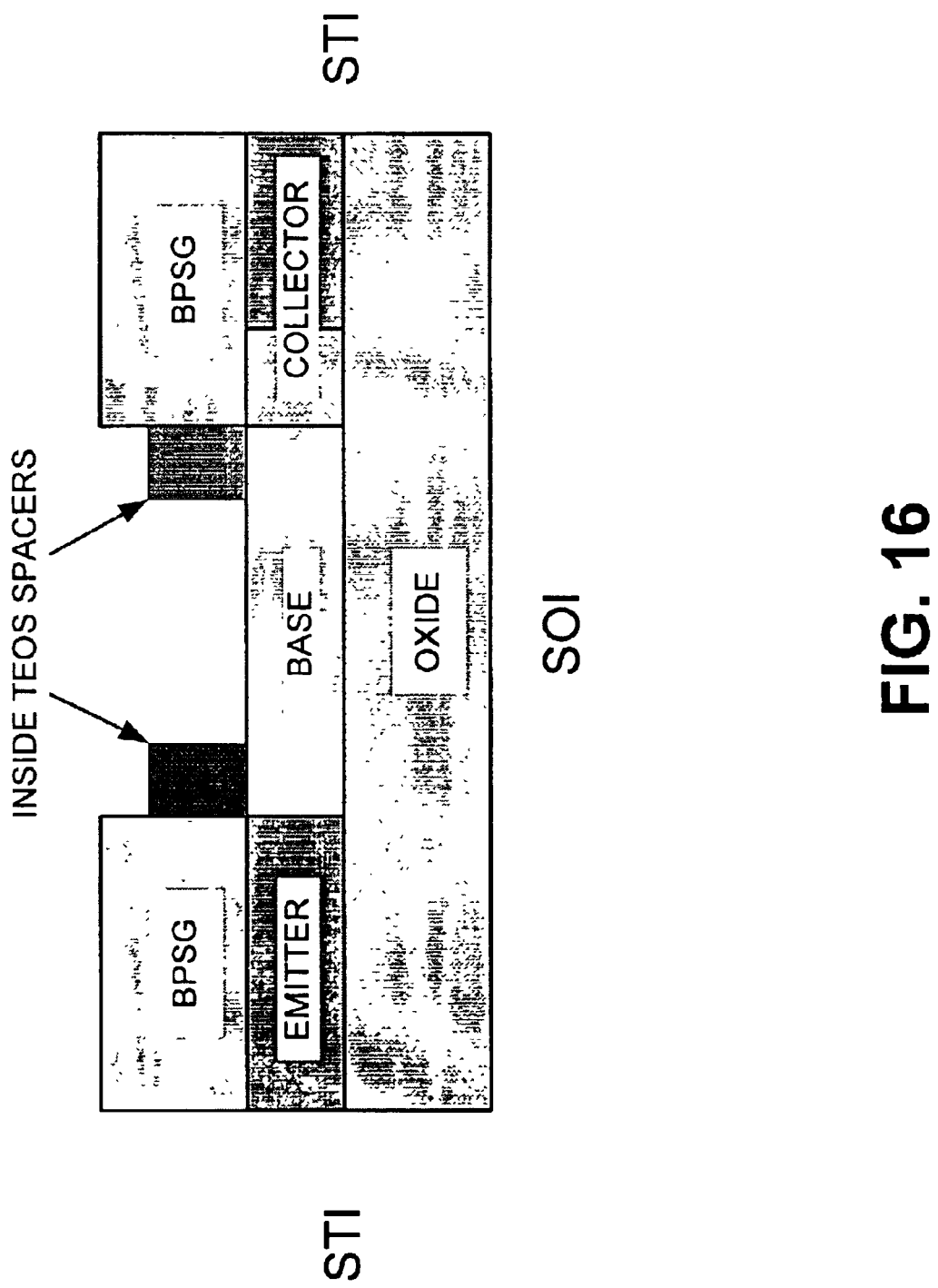
Figure 17:
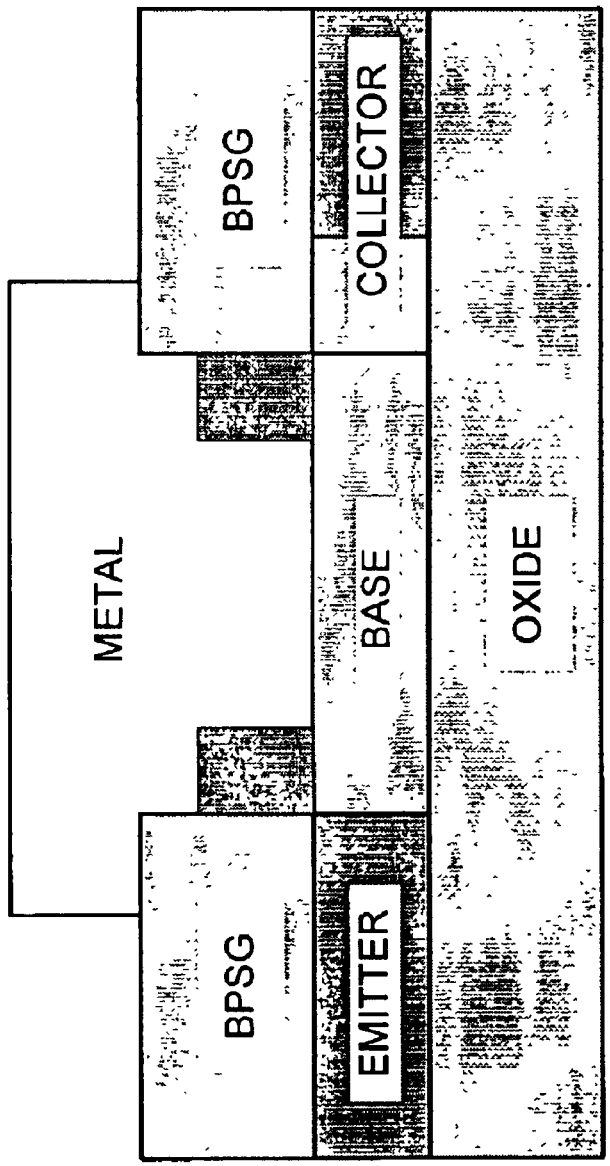
Figure 18:
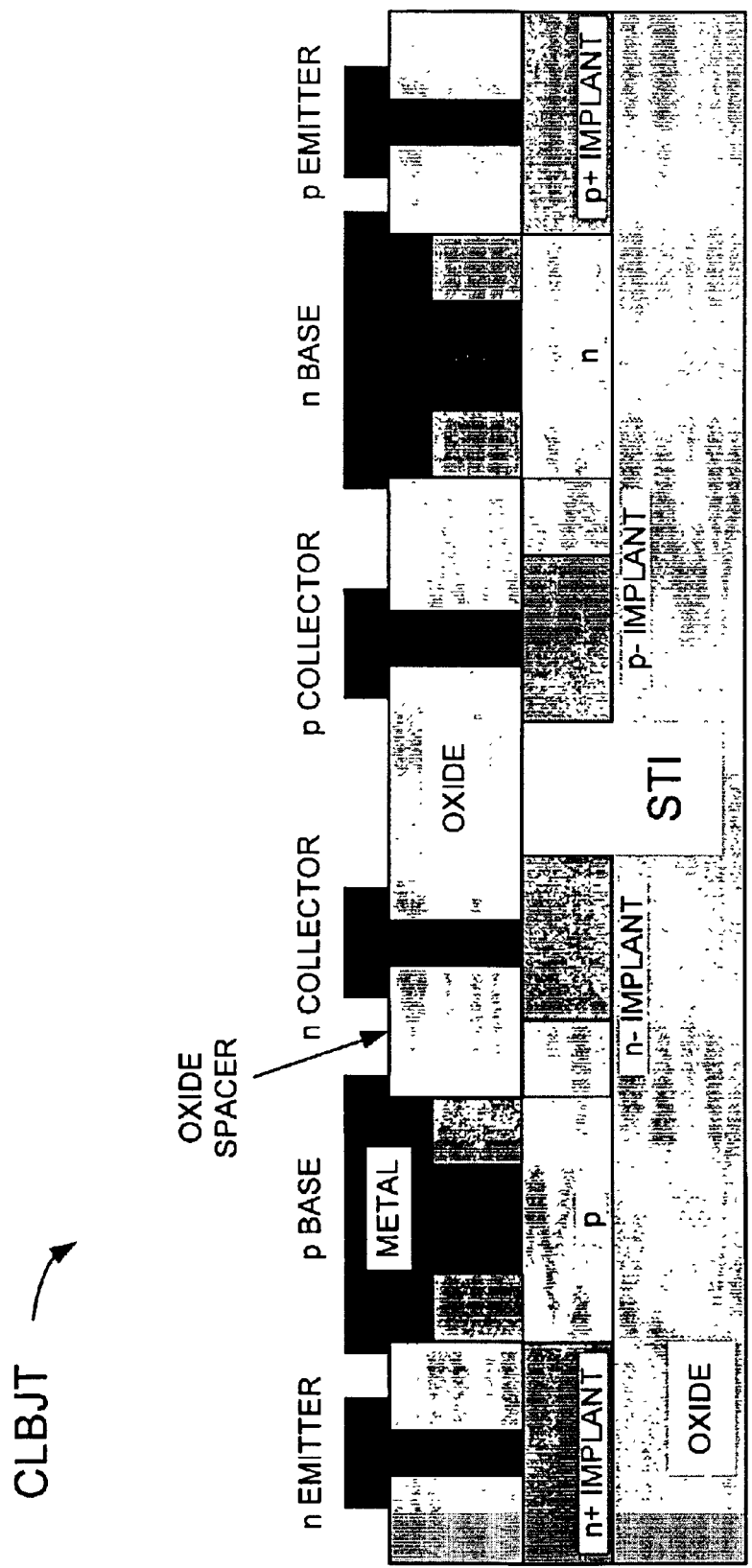

An inside TEOS spacer deposition and etch back may be performed (act 1350) followed by a contact dry etch (act 1355), as illustrated in FIG. 16. Contact metal deposition and etch back (or CMP) may be performed in a well known manner (act 1360), as illustrated in FIG. 17. Conventional processing may then be performed to form the contact and interconnect, etc. FIG. 18 illustrates an exemplary resulting CLBJT in an implementation consistent with the present invention.

Advantages of a CLBJT fabricated in the manner described above include the following.

(1) The CLBJT fabrication process is compatible with conventional CMOS fabrication processing thereby simplifying the CLBJT fabrication process.

(2) The circuit design is comparable to existing CMOS circuit designs. The VT (threshold voltage) can be scaled to the input VBE. By replacing the drain with a collector, gate with a base, and source with an emitter, the biasing scheme of a CLBJT is almost the same as a CMOS.

(3) The current driving capability of a CLBJT may be much higher than a CMOS.

(4) There is no limit associated with scaling the gate oxide because no gate oxide is required.

(5) High ultra-large scale integration (ULSI) packing density may be achieved, which may be comparable to CMOS.

(6) Very few, or even, no mask sets additional to conventional CMOS mask sets are needed for CLBJT.

For CMOS, the following equation is a rough estimate of the saturation drain current:

$$Idsat/W=(Cox*ueff/L)*(Vgs-Vtlin-Vds/2)*Vds=2.5 \text{ mA/um},$$

where Vgs=1.2 Volts, Cox represents the gate oxide capacitance, L represents the transistor length, and ueff is the MOS effective surface mobility. By contrast, for a CLBJT fabricated as described above, $$Ic/W=(ni^2/Nb)*\exp(Vbe/0.0259)*ts=50 \text{ mA/um},$$

where Ic represents the collector current, W represents the transistor width, ni represents the intrinsic carrier concentration, ts is the SOI silicon thickness, and Nb is the base doping concentration. From the above calculation, the drive current of the CLBJT is approximately 4 decades higher than the CMOS, assuming that Vgs or Vbe is 1.2 Volts.

CONCLUSION

Methods consistent with the present invention provide a lateral BJT fabrication process that is similar to conventional CMOS fabrication processing. By fabricating the lateral BJT in a manner similar to conventional CMOS fabrication processing, simplified lateral BIT fabrication processing can be achieved.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, while series of acts have been described with regard to FIGS. 1 and 13, the order of the acts may be varied in other implementations consistent with the present invention. Moreover, non-dependent acts may be implemented in parallel.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) processes can be employed.

In practicing the present invention, conventional photolithographic and etching techniques are employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

No element, act, or instruction used in the description of the present application should be construed as critical or essential to the invention unless explicitly described as such.

Also, as used herein, the article "a" is intended to include one or more items. Where only one item is intended, the term "one" or similar language is used.

The scope of the invention is defined by the claims and their equivalents.

What is claimed is:

1. A method for fabricating a lateral bipolar junction transistor in an active area of a substrate, comprising:

forming a base structure directly on a central portion of the active area;

implanting a first type of dopant into the active area for forming an emitter region and a collector region;

reducing a width of the base structure; and forming contacts and interconnects for the base structure and emitter and collector regions.

2. The method of claim 1 wherein the forming a base structure includes:

depositing silicon; and performing a silicon etch.

3. The method of claim 1 wherein a thickness of the base structure is approximately 1500 Å.

4. The method of claim 1 further comprising:

forming isolation structures on the substrate to create the active area.

5. The method of claim 1 further comprising:

forming, prior to forming the base structure, a well in the active area using a second type of dopant, the second type of dopant being different than the first type of dopant.

6. The method of claim 1 wherein the emitter region and collector region are formed on opposite sides of the base structure.

7. The method of claim 1 further comprising:

forming, prior to implanting the first type of dopant, spacers on either side of the base structure.

8. The method of claim 1 further comprising:

depositing, after the implanting, a thick layer of tetraethoxy silane (TEOS) on the active area; and performing a TEOS chemical-mechanical polish to expose a top surface of the base structure.

9. The method of claim 8 further comprising:

performing a base contact implant after the TEOS chemical-mechanical polish.

10. The method of claim 9 wherein the performing a base contact implant includes:

implanting boron into the base structure.

11. The method of claim 9 further comprising:

performing a hydrogen fluoride wet etch; and performing a rapid thermal anneal.

12. A method for fabricating a lateral bipolar junction transistor comprising:

forming a well in an active area of a substrate;

forming a base structure in a central portion of the active area, the base structure being formed directly on the substrate;

forming spacers on opposite sides of the base structure;

implanting a dopant to form an emitter region and a collector region;

implanting boron to form a contact for the base structure;

reducing a width of the base structure;

performing a rapid thermal anneal;

depositing inter-layer dielectric material over the active area; and forming metal interconnects over the active area.

13. The method of claim 12 wherein the spacers are formed from tetraethoxy silane (TEOS).

14. The method of claim 12 wherein the emitter and collector regions are formed on opposite sides of the base structure.

15. A method comprising:

forming a base structure directly on a central portion of an active area of a substrate;

depositing a layer of tetraethoxy silane (TEOS) over the base structure;

planarizing the TEOS layer to expose a top surface of the base structure;

implanting boron into the base structure;

performing a hydrogen fluoride wet etch; and reducing a width of the base structure.

16. The method of claim 15 wherein the hydrogen fluoride wet etch removes the TEOS layer.

17. The method of claim 15 further comprising performing an annealing process after reducing the width of the base structure.

* * * * *